United States Patent
Park et al.

(10) Patent No.: US 9,431,633 B2
(45) Date of Patent: Aug. 30, 2016

(54) ORGANIC LIGHT EMITTING DIODE DISPLAY DEVICE

(71) Applicant: LG DISPLAY CO., LTD., Seoul (KR)

(72) Inventors: Jae-Hyun Park, Paju-si (KR); Jae-Jung Han, Seoul (KR); Sun-Man Kim, Goyang-si (KR); Eun-Hee Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/582,674

(22) Filed: Dec. 24, 2014

(65) Prior Publication Data

US 2015/0188092 A1 Jul. 2, 2015

(30) Foreign Application Priority Data

Dec. 27, 2013 (KR) .................. 10-2013-0165357

(51) Int. Cl.
*H01L 51/52* (2006.01)
*H01L 27/32* (2006.01)

(52) U.S. Cl.
CPC .......... *H01L 51/5271* (2013.01); *H01L 51/52* (2013.01); *H01L 51/5281* (2013.01); *H01L 27/3244* (2013.01); *H01L 51/5275* (2013.01)

(58) Field of Classification Search
CPC ............... H01L 51/5271; H01L 27/32; H01L 51/5281; H01L 51/52; H01L 27/3244; H01L 51/5275
See application file for complete search history.

(56) References Cited

U.S. PATENT DOCUMENTS

| | | | |
|---|---|---|---|
| 7,449,833 B2 * | 11/2008 | Kobayashi | 313/506 |
| 8,373,181 B2 * | 2/2013 | Aurongzeb et al. | 257/99 |
| 8,542,428 B2 * | 9/2013 | Bae et al. | 359/296 |
| 2005/0242709 A1 * | 11/2005 | Yamauchi | 313/498 |
| 2008/0278063 A1 * | 11/2008 | Cok | 313/500 |
| 2009/0109539 A1 * | 4/2009 | Devos et al. | 359/601 |
| 2009/0116107 A1 * | 5/2009 | Kindler et al. | 359/457 |
| 2011/0146889 A1 * | 6/2011 | Hwang | B32B 37/025 156/150 |
| 2012/0049724 A1 * | 3/2012 | Nakai | 313/498 |
| 2012/0068596 A1 * | 3/2012 | Inoue et al. | 313/504 |
| 2013/0299816 A1 * | 11/2013 | Bessho et al. | 257/40 |
| 2015/0340346 A1 * | 11/2015 | Chu | H01L 25/0753 257/89 |

\* cited by examiner

*Primary Examiner* — William Coleman
(74) *Attorney, Agent, or Firm* — Dentons US LLP (57) ABSTRACT

Disclosed is an organic light emitting diode display device having improved light extraction efficiency and display quality. The organic light emitting diode display device includes a plurality of sub-pixels including organic light emitting cells arranged in an inner side of a substrate, a groove formed between neighboring sub-pixels, and a light extraction pattern formed over an outer surface of the substrate.

7 Claims, 8 Drawing Sheets

ORGANIC LIGHT EMITTING DIODE DISPLAY DEVICE

This application claims the benefit of Korean Patent Application No. 10-2013-0165357, filed on Dec. 27, 2013, which is hereby incorporated by reference for all purposes as if fully set forth herein.

BACKGROUND OF THE INVENTION

1. Field of the Invention

The present invention relates to an organic light emitting diode display device having improved light extraction efficiency and display quality.

2. Discussion of the Related Art

Image display devices, which display a variety of information on a screen, are a core technology of information and communication and are becoming increasingly thinner, lighter, more portable and higher performance. Due to pursuit of extended lifespan and convenience, flexible displays are required and thereby organic light emitting diode display devices controlling the light emitting amount of an organic emission layer are receiving attention recently.

Organic light emitting diode display devices include a first electrode, an organic light emission layer and a second electrode sequentially laminated between an upper substrate and a lower substrate. In organic light emitting display devices, an electric field is formed in a first electrode and a second electrode in both end portions of an organic light emission layer and thereby an electroluminescence phenomenon occurring due to energy release upon recombination of electrons and holes by injecting the electrons and the holes into an organic light emission layer, and transferring the electrons and the holes to the organic light emission layer is used.

The organic light emitting diode display device as described above does not require a separate light source unlike liquid crystal displays. Therefore, the organic light emitting diodes are light weight, and have a thin thickness. In addition, the organic light emitting diodes have high quality characteristics such as low power consumption, high luminance, high reaction rate and the like, and thereby are receiving attention as a next generation display device of portable electronic devices. Recently, to improve light extraction efficiency of the organic light emitting diode display devices, a light extraction pattern is further provided.

Figure 1:
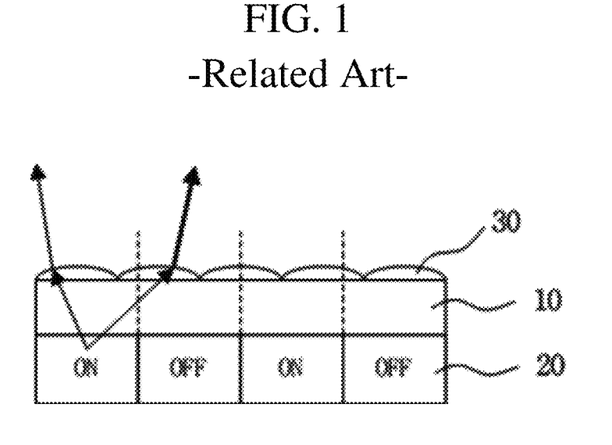
FIG. 1 is a sectional view of a general organic light emitting diode display device.
Figure 2A:
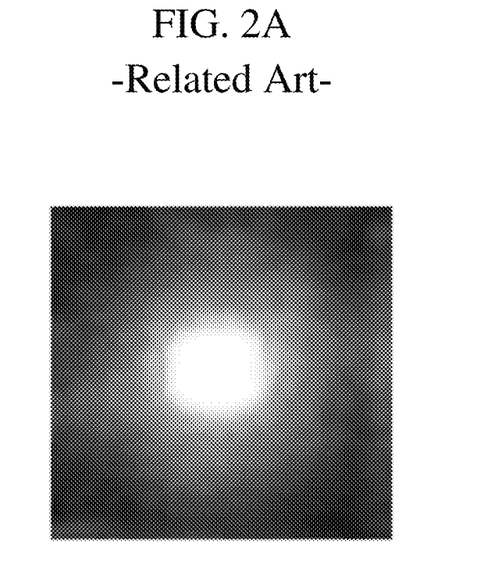
FIGS. 2A and 2B are images illustrating defects of a general organic light emitting diode display device.
Figure 2B:
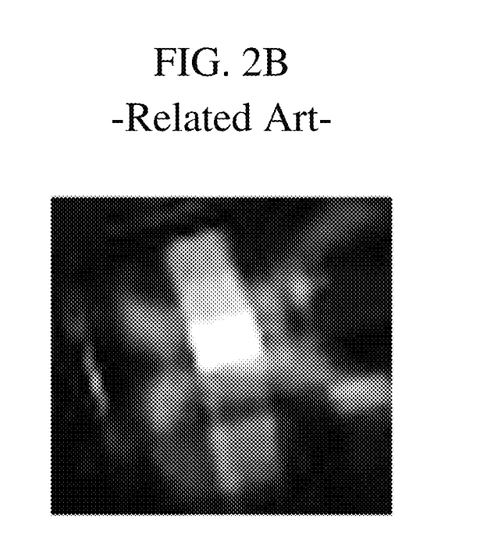

FIG. 1 is a sectional view of a general organic light emitting diode display device, and FIGS. 2A and 2B are images illustrating defects in a general organic light emitting diode display device.

As illustrated in FIG. 1, the general organic light emitting diode display device further includes a light extraction pattern 30 on a substrate 10 in which light generated from an organic light emitting cell of each sub-pixel 20 is emitted to the outside. Additionally, light generated from the organic light emitting cells affects a neighboring sub-pixel 20 through the light extraction pattern 30. For example, even in an area corresponding to an OFF sub-pixel, an image is displayed by a neighboring ON sub-pixel and, as such, defects such as a blur, ghost image and the like occur as illustrated in FIGS. 2A and 2B.

SUMMARY OF THE INVENTION

Accordingly, the present invention is directed to an organic light emitting diode display device that substantially obviates one or more problems due to limitations and disadvantages of the related art.

An object of the present invention is to provide an organic light emitting diode display device having improved display quality by blocking light pathways through grooves formed between neighboring sub-pixels.

Additional advantages, and features of the invention will be set forth in part in the description which follows and in part will become apparent to those having ordinary skill in the art upon examination of the following or may be learned from practice of the invention. These and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting diode display device according to the present invention includes a plurality of sub-pixels, including an organic light emitting cell, arranged in an inner side of a substrate, a groove formed between the neighboring sub-pixels, and a light extraction pattern formed over an outer surface of the substrate.

In another aspect of the present invention, an organic light emitting diode display device according to the present invention includes a plurality of sub-pixels, including an organic light emitting cell, arranged in an inner side of a substrate, a light extraction pattern formed over an outer surface of the substrate, and a resin layer formed between the organic light emitting cells and the substrate, wherein a hole is formed between the neighboring sub-pixels in the resin layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, an organic light emitting diode display device according to a first embodiment of the present invention will be described in detail with reference to the accompanying drawings.

Figure 3A:
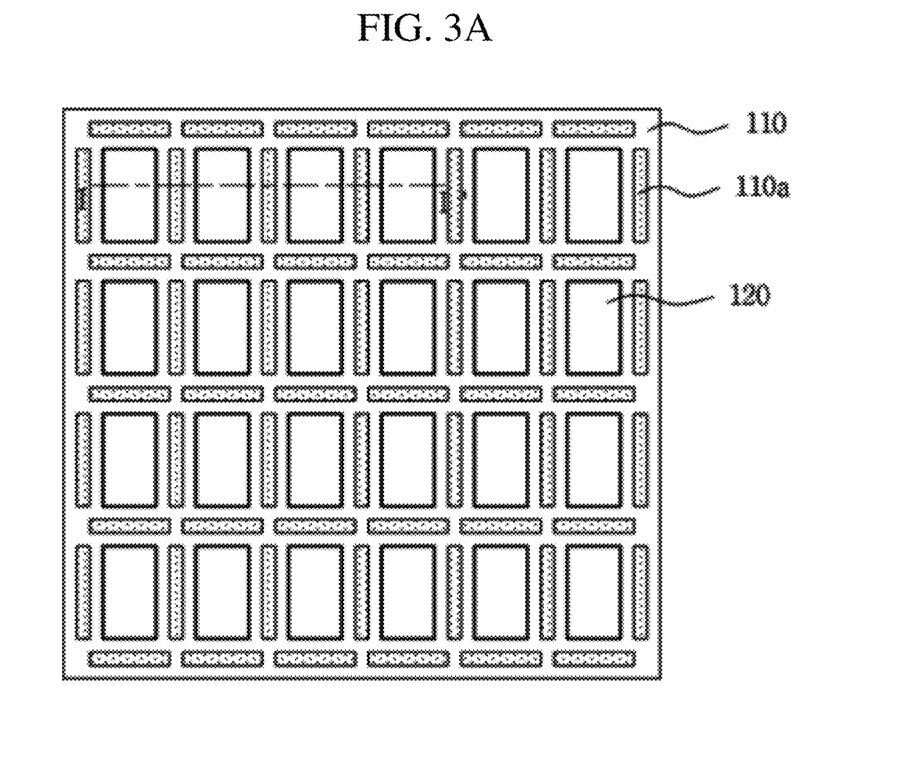
FIG. 3A is a plan view of an organic light emitting diode display device according to a first embodiment of the present invention.
Figure 3B:
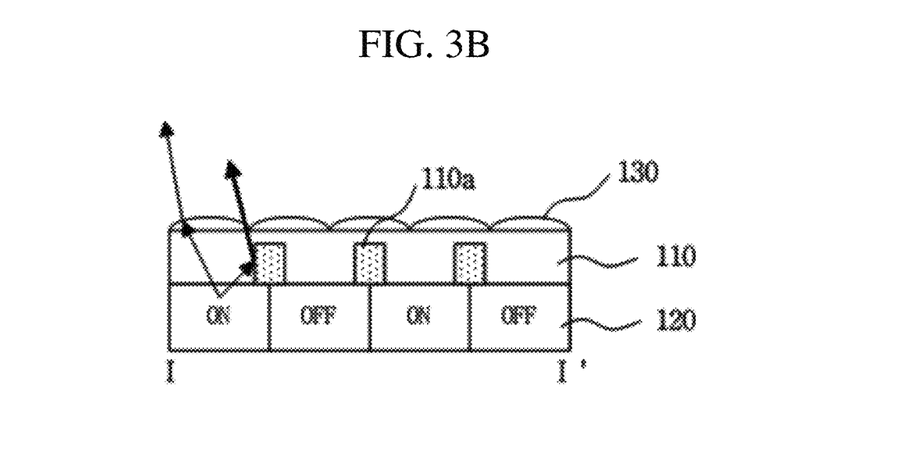
FIG. 3B is a sectional view taken along line I-I' in FIG. 3A.
Figure 3C:
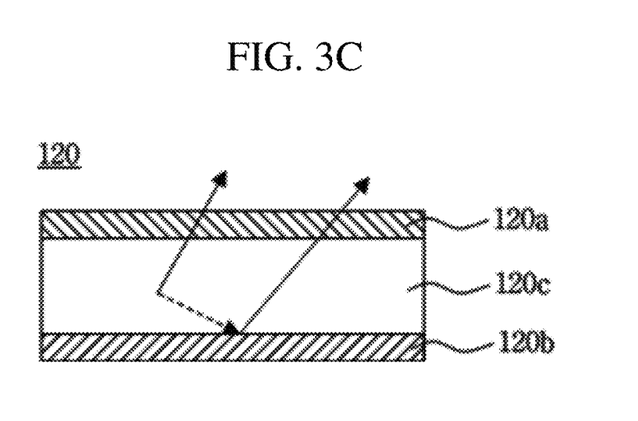
FIG. 3C is a sectional view of a sub-pixel of FIG. 3A.
Figure 4:
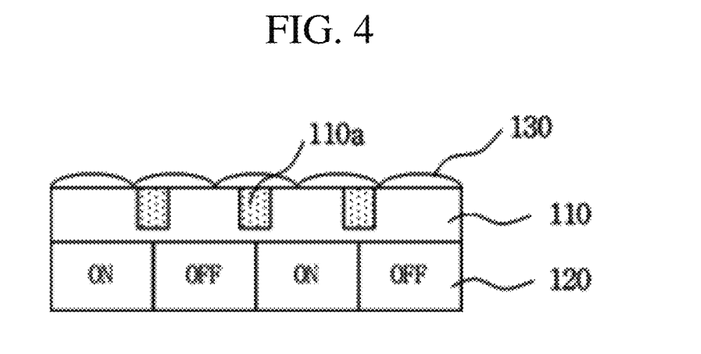
FIG. 4 is a sectional view illustrating grooves formed in an outer surface of a substrate.

FIG. 3A is a plan view of the organic light emitting diode display device according to the first embodiment of the present invention and FIG. 3B is a sectional view taken along line I-I' in FIG. 3A. In addition, FIG. 3C is a sectional view of a sub-pixel of FIG. 3A and FIG. 4 is a sectional view illustrating grooves formed in the outside of a substrate.

As shown in FIG. 3A, the organic light emitting diode display device according to the first embodiment of the present invention includes a plurality of sub-pixels 120, including an organic light emitting cell, on a substrate 110 in which a groove 110a is formed between the neighboring sub-pixels 120. The substrate 110 is formed of a material selected from glass, polycarbanate (PC), polymethylmethacrylate (PMMA), Polystyrene (PS), poly ethylene terephthalate (PET) and the like. As shown in FIG. 3B, a light extraction pattern 130 is formed over an upper surface of the substrate 110 in which light is emitted. The light extraction pattern 130 is provided to improve light extraction efficiency of a display device and the groove 110a is formed in a lower portion of the substrate 110 in which the light extraction pattern 130 is not formed.

In particular, on the substrate 110, a plurality of sub-pixels 120 is defined by crossings of data lines and gate lines. In each of the sub-pixels 120, a thin layer transistor and the organic light emitting cells connected to the thin layer transistor are formed. As shown in FIG. 3C, the organic light emitting cells include a first electrode 120a, an organic light emitting layer 120c and a second electrode 120a which are sequentially laminated. The first electrode 120a is connected to the thin layer transistor.

By adding an electric field to the first electrode 120a and second electrode 120b, and then injecting and transferring electrons and holes in the organic light emitting layer 120c, electrons and holes forming a pair in the organic light emitting layer 120c emit light while dropping from an excited state to a ground state. Light emitted from the organic light emitting layer 120c passes through the first electrode 120a and then is emitted to the outside through the substrate 110. Alternatively, after being reflected in the second electrode 120b, light emitted from the organic light emitting layer 120c passes through the first electrode 120a and then is emitted to the outside through the substrate 110.

Among light emitted from an organic light emitting cell 120 and incident on the substrate 110, only light incident on a surface of the substrate 110 in an incident angle of approximately 42° or less is emitted to the outside from an area corresponding to a related sub-pixel to the outside. The remaining light is totally reflected on a surface of the substrate 110 and is dissipated in the substrate 110. Therefore, general organic light emitting diode display devices have extremely low light extraction efficiency. Accordingly, the light extraction pattern 130 is provided over an outer surface of the substrate 110.

The light extraction pattern 130 may be formed of a UV resin, polymethylmethacrylate (PMMA), polystyrene (PS), polycarbanate (PC) and the like. Although, in the figures, the light extraction pattern 130 is a lens type, the light extraction pattern 130 may be other types such as a prism, pyramid, cylinder and the like.

Through the light extraction pattern 130, an image is realized by light emitted from a neighboring ON sub-pixel even in an area corresponding to an OFF sub-pixel. In particular, when the light extraction pattern 130 is not formed, light, not emitted through the substrate 110 to the outside, is totally reflected on a surface of the substrate 110. However, when the light extraction pattern 130 is provided, among light emitted from the organic light emitting cell 120 and incident on the substrate 110, incident light of an incident angle greater than a critical angle is emitted through the light extraction pattern 130 to the outside.

Since light having an incident angle greater than a critical angle proceeds to neighboring sub-pixels, light of an incident angle greater than a critical angle is emitted to the outside through the light extraction pattern 130 in areas corresponding to the neighboring sub-pixels. Therefore, defects such as blurring, ghosting and the like may occur, and the contrast ratio of a display device may be deteriorated. Especially, a light proceeding distance is lengthened with increasing thickness of the substrate 110 and an occurrence probability and occurrence degree of the defects described above intensify with increasing thickness of the substrate 110.

Accordingly, in the substrate 110 of the organic light emitting diode display device according to the first embodiment of the present invention, the groove 110a is formed between neighboring sub-pixels 120. The groove 110a may be formed in an inner side of the substrate 110 in which the light extraction pattern 130 is not formed, or, as shown in FIG. 4, may be formed in an outer side of the substrate 110.

The groove 110a may be filled with air or a reflective material. The reflective material is a metal compound or copolymer compound having light reflection characteristics. Here, an occurrence probability of total reflection increases with increase in a refractive index difference between the substrate 110 and the reflective material, or a refractive index difference between the substrate 110 and air, and thereby light interruption effect is improved.

For example, when the groove 110a is filled with air, most light proceeding to neighboring OFF sub-pixels between light emitted in an ON sub-pixel by refractive index difference between the substrate 110 and air is totally reflected. Accordingly, light emitted from an ON sub-pixel is blocked from proceeding to the neighboring sub-pixel and, as such, defects such as blurring, ghosting and the like may be prevented and the contrast ratio of a display device may be improved. In addition, when the groove 110a is filled with the reflective material, light proceeding to neighboring OFF sub-pixels among light emitted from an ON sub-pixel is reflected.

Here, when the width of the groove 110a is too wide, transmittance is reduced. Therefore, the width of the groove 110a is preferably 50% or less based on the width of the sub-pixel 120 and the center of the groove 110a is preferably located within 20% from the center of a boundary of the sub-pixel 120. As shown in the figure, the groove 110a may be a separated structure.

Figure 5A:
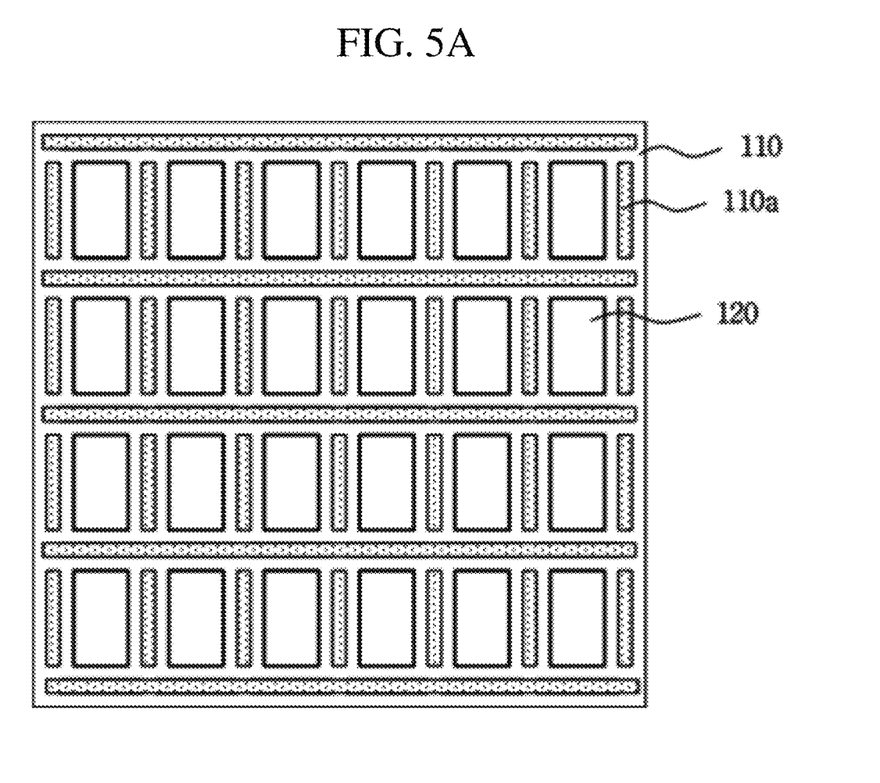
FIGS. 5A to 5C are plan views illustrating different groove types.
Figure 5B:
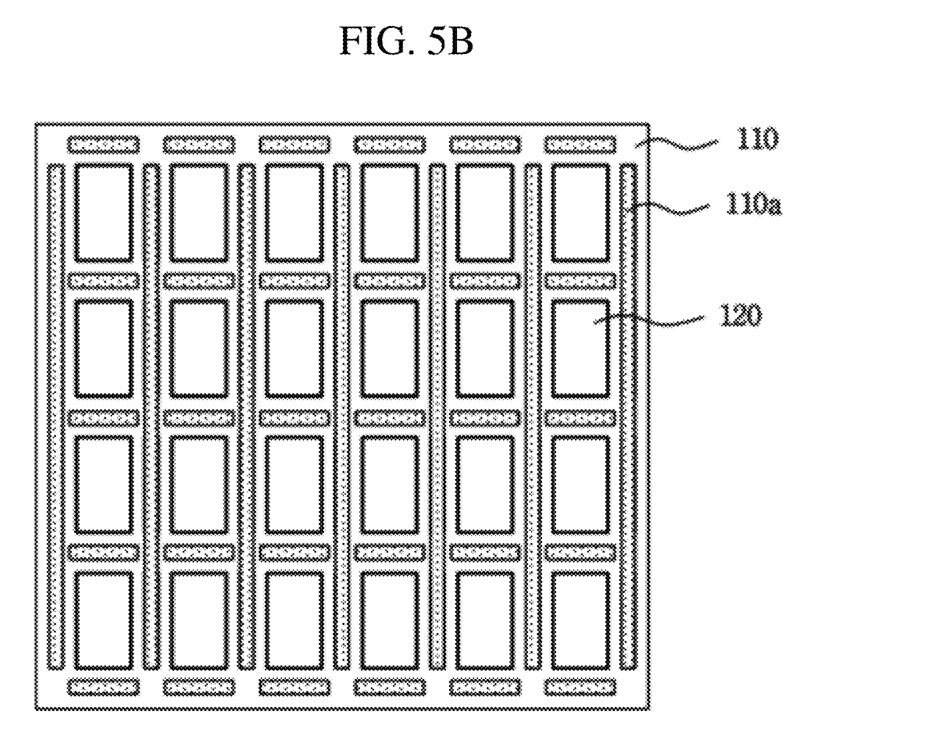
Figure 5C:
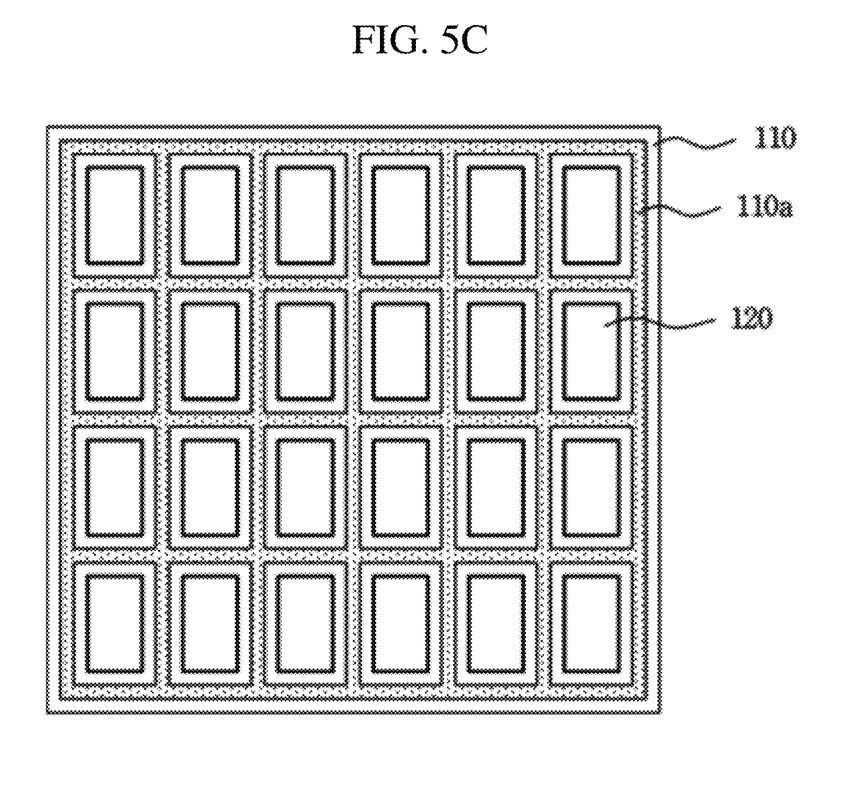

FIGS. 5A to 5C are plan views illustrating different groove types.

As shown in FIGS. 5A and 5B, the groove 110a may be formed in a partially connected structure. Alternatively, as shown in FIG. 5C, the groove 110a may be formed in an integral type such that boundaries of the sub-pixels 120 are surrounded. The type of the groove 110a is not limited to the structures as described above and may be modified to be a variety of structures.

Figure 6:
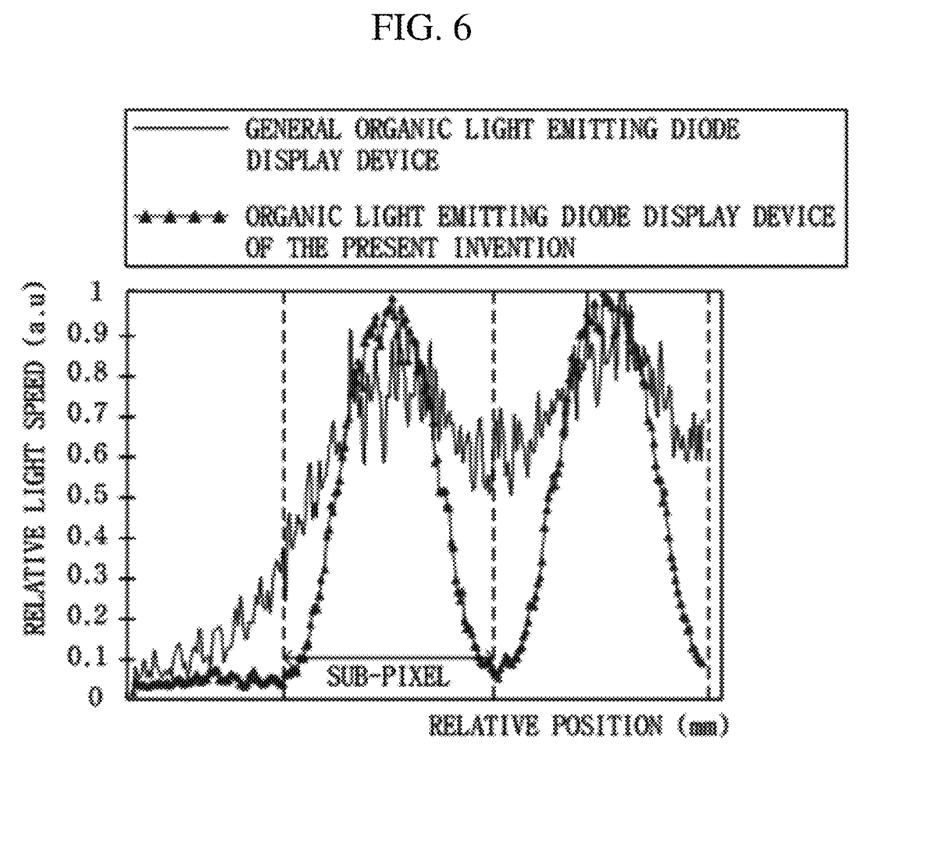
FIG. 6 is a graph comparing contrast characteristics of an organic light emitting diode display device according to the first embodiment of the present invention and a general organic light emitting diode display device.

FIG. 6 is a graph comparing the contrast characteristics of the organic light emitting diode display device according to the first embodiment of the present invention and a general organic light emitting diode display device. In the organic light emitting diode display device according to the first embodiment of the present invention, sub-pixels having a width of 600 μm are formed on the substrate formed of glass. Here, the width of a hole is 10 μm and the depth of the hole is 400 μm.

As shown in FIG. 6, among light emitted from the organic light emitting cells of the general organic light emitting diode display device and incident on substrate, light having an incident angle greater than a critical angle is emitted to the outside from areas corresponding to the neighboring sub-pixel through the light extraction pattern and thereby light is emitted between the neighboring sub-pixels. Therefore, an image may be realized in an ON sub-pixel and neighboring OFF sub-pixels.

On the other hand, the organic light emitting diode display device according to the first embodiment of the present invention prevents light emitted from the sub-pixel through the hole from proceeding to neighboring sub-pixels. Therefore, light is not emitted from spaces between the sub-pixels. Accordingly, a contrast ratio is not reduced and display characteristics are improved.

Hereinafter, an organic light emitting diode display device according to a second embodiment of the present invention will be described.

Figure 7:
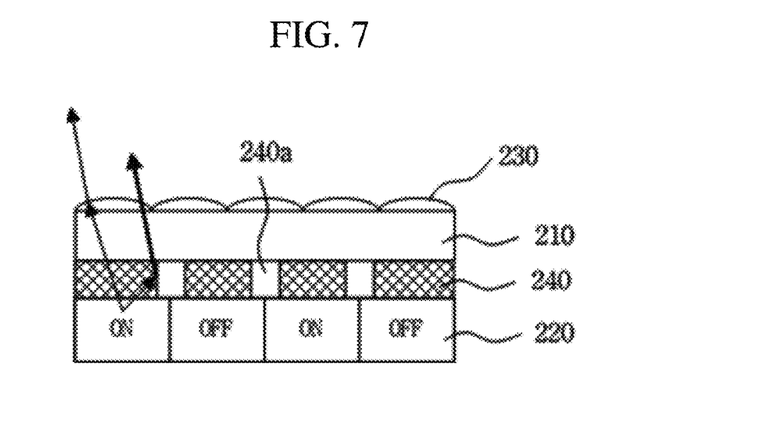
FIG. 7 is a sectional view of an organic light emitting diode display device according to a second embodiment of the present invention.

FIG. 7 is a sectional view of the organic light emitting diode display device according to the second embodiment of the present invention.

As shown in FIG. 7, in the organic light emitting diode display device according to the second embodiment of the present invention, grooves are not formed in a substrate 210 and a resin layer 240 including holes 240a is formed on the substrate 210. In addition, sub-pixels 220 including the organic light emitting cell are formed on the resin layer 240. The hole 240a is formed between the neighboring sub-pixels 220 and the holes 240a penetrate the resin layer 240. Therefore, the depth of the hole 240a is the same as the thickness of the resin layer 240.

The resin layer 240 is formed of a UV Resin, polymethylmethacrylate (PMMA), polystyrene (PS), polycarbonate (PC) or the like. The hole 240a may be filled with air or the reflective material as described with respect to the first embodiment above. Here, an occurrence probability of total reflection increases with increase in a refractive index difference of a resin layer 230 and the reflective material, or a refractive index difference between the resin layer 230 and air and thereby light interruption effect is improved.

When the hole 240a is too wide, transmittance is reduced. Therefore, the width of the hole 240a is preferable 50% or less based on the width of the sub-pixel 120 and the center of the hole 240a preferably locates in 20% from the center of a boundary of the sub-pixel 120. The hole 240a also may be formed in a separated structure, or in an integral type such that a plurality of the sub-pixels 120 is surrounded, like the groove in described as the first embodiment above. The hole 240a may be modified to a variety of types.

As described above, in the organic light emitting diode display device according to each embodiment of the present invention, light is blocked by the grooves 110a and holes 240a formed between the neighboring sub-pixels in the substrate 110 or the resin layer 240. Therefore, defects such as blurring, ghosting and the like may be prevented and display quality may be improved by realizing an exact image.

As is apparent from the foregoing description, in an organic light emitting diode display device according to each embodiment of the present invention, light is blocked by a groove formed between neighboring sub-pixels in a substrate or resin layer. Therefore, defects such as blurring, ghosting and the like may be prevented and display quality is improved by realizing an exact image.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting diode display device comprising:
   a substrate including grooves;
   a plurality of sub-pixels comprising organic light emitting cells arranged in an inner side of the substrate; and
   a light extraction pattern over an outer side surface of the substrate,
   wherein each of the grooves corresponds to each boundary between neighboring subpixels and is engraved on the substrate.

2. The organic light emitting diode display device according to claim 1, wherein the grooves are filled with air or a reflective material.

3. The organic light emitting diode display device according to claim 1, wherein the grooves are positioned in the inner side of the substrate or the outer side of the substrate.

4. The organic light emitting diode display device according to claim 1, wherein the grooves integrally surround boundaries of the sub-pixels.

5. An organic light emitting diode display device comprising:
   a substrate;
   a plurality of sub-pixels comprising organic light emitting cells arranged in an inner side of the substrate;
   a light extraction pattern over an outer side of the substrate;
   a resin layer between the organic light emitting cells and the substrate; and
   a hole corresponding to each boundary between neighboring sub-pixels and penetrating the resin layer.

6. The organic light emitting diode display device according to claim 5, wherein the hole is filled with air or a reflective material.

7. The organic light emitting diode display device according to claim 5, wherein the hole integrally surrounds boundaries of the sub-pixels.

* * * * *